United States Patent
Wu

(10) Patent No.: US 10,679,681 B1
(45) Date of Patent: Jun. 9, 2020

(54) SENSING-AMPLIFYING DEVICE

(71) Applicants: Jiangsu Advanced Memory Technology Co., Ltd., Jiangsu (CN); ALTO MEMORY TECHNOLOGY CORPORATION, Hsinchu County (TW)

(72) Inventor: Jui-Jen Wu, Hsinchu County (TW)

(73) Assignees: Jiangsu Advanced Memory Technology Co., Ltd., Jiangsu (CN); ALTO MEMORY TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/361,199

(22) Filed: Mar. 21, 2019

(30) Foreign Application Priority Data

Dec. 25, 2018 (CN) .......................... 2018 1 1591518

(51) Int. Cl.
*G11C 7/00* (2006.01)
*G11C 7/06* (2006.01)
*G11C 11/4091* (2006.01)

(52) U.S. Cl.
CPC ............ *G11C 7/06* (2013.01); *G11C 11/4091* (2013.01); *G11C 2207/063* (2013.01)

(58) Field of Classification Search
CPC . G11C 13/004; G11C 2013/0057; G11C 7/06; G11C 11/4091; G11C 2207/063
See application file for complete search history.

(56) References Cited

U.S. PATENT DOCUMENTS

| | | | |
|---|---|---|---|
| 2006/0146600 A1* | 7/2006 | Johnson | G11C 13/0004 365/163 |
| 2008/0007992 A1* | 1/2008 | Wang | G11C 7/062 365/158 |
| 2019/0108886 A1* | 4/2019 | Paolino | G11C 16/28 |
| 2019/0165045 A1* | 5/2019 | Chung | G11C 17/165 |
| 2019/0214079 A1* | 7/2019 | Disegni | G06F 13/1668 |
| 2019/0325934 A1* | 10/2019 | Matsubara | G11C 8/08 |

* cited by examiner

*Primary Examiner* — Toan K Le
(74) *Attorney, Agent, or Firm* — CKC & Partners Co., LLC

(57) ABSTRACT

A sensing-amplifier device includes a first input terminal, a second input terminal, a reference unit, and a sense amplifier. The reference unit is configured to provide a reference signal. The switching unit is selectively coupled to the first input terminal, the second input terminal, and a reference unit. The sense amplifier includes two terminals. The two terminals of the sense amplifier are coupled to the first input terminal and the second input terminal respectively by switching of the switching unit so as to operate in a twin memory unit mode, or one terminal of the sense amplifier is coupled to the first input terminal or the second input terminal and the other terminal of the sense amplifier is coupled to the reference unit by switching of the switching unit so as to operate in a single memory unit mode.

8 Claims, 6 Drawing Sheets

SENSING-AMPLIFYING DEVICE

RELATED APPLICATIONS

This application claims priority to China Application Serial Number 201811591518.1, filed Dec. 25, 2018, which is herein incorporated by reference.

BACKGROUND OF THE INVENTION

Field of Invention

The present invention relates to a sensing-amplifying device. More particularly, the present invention relates to a sensing-amplifying device applied in a memory.

Description of Related Art

In memory technology, a resistive random-access memory includes a phase change memory (PCM), which can change a resistance value of a component by a crystal phase change of the material thereof, so as to store information by a change in resistance value. When the material in the memory element is crystalline, it exhibits a low resistance value, and conversely, when the material in the memory element is in an amorphous state, it exhibits a high resistance value, thereby storing data such as "1" or "0".

In the prior art, when reading the data of the memory unit in the memory device, the single memory unit is turned on, and the current corresponding to the single memory unit is compared with the reference current to determine whether a single data stored in the memory unit is "1" or "0". However, comparisons with current values may cause errors due to different bias voltages. Furthermore, the judgment of data reading with a single memory unit is liable to cause errors. If the memory device for reading data need to be reconstructed for preventing the above-mentioned error, the sense amplifier needs to be adjusted accordingly.

As shown in FIG. 1, it is a traditional memory with a sense amplifier. One terminal is coupled to one of the bit lines, and another terminal is coupled to the reference unit. The current of one of the bit lines and the current of the reference unit are compared to determine whether the data stored in the memory unit is "1" or "0". The disadvantages of this structure are described below: (1) such memory can only be used in a memory device which has single memory mode; (2) the reference unit is a transistor, and the value of the reference current is related to the value of the reference bias. The reference current needs to be set at the middle value between the high current and the low current of the memory element, such that a symmetrical noise margin may be obtained. However, if the high current and the low current of the memory element are shifted, the reference voltage must be adjusted. In addition, the reference current is generated from the transistor, and the current of the resistive random-access memory unit is decided according to the resistance across the memory unit. During manufacturing, the process variation mechanism of the resistor in the memory unit is different from that of the transistor, so the reference current cannot accurately adapt to the change of the memory unit.

SUMMARY OF THE INVENTION

The following presents a brief summary of the disclosure in order to provide a basic understanding to the reader. This summary is not an extensive overview of the disclosure and it does not identify key/critical elements of the present invention or delineate the scope of the present invention.

One aspect of the present disclosure is directed to A sensing-amplifier device includes a first input terminal, a second input terminal, a reference unit, and a sense amplifier. The first input terminal is coupled to a first memory unit. The second input terminal is coupled to a second memory unit. The reference unit is configured to provide a reference signal. The switching unit is selectively coupled to the first input terminal, the second input terminal, and a reference unit. The sense amplifier includes two terminals. The two terminals of the sense amplifier are coupled to the first input terminal and the second input terminal respectively by switching the switching unit so as to operate in a twin memory unit mode, or one terminal of the sense amplifier is coupled to the first input terminal or the second input terminal and the other terminal of the sense amplifier is coupled to the reference unit by switching the switching unit so as to operate in a single memory unit mode.

These and other features, aspects, and advantages of the present invention, as well as the technical means and embodiments employed by the present invention, will become better understood with reference to the following description in connection with the accompanying drawings and appended claims.

BRIEF DESCRIPTION OF THE DRAWINGS

The invention can be more fully understood by reading the following detailed description of the embodiment, with reference made to the accompanying drawings as follows.

Figure 1:
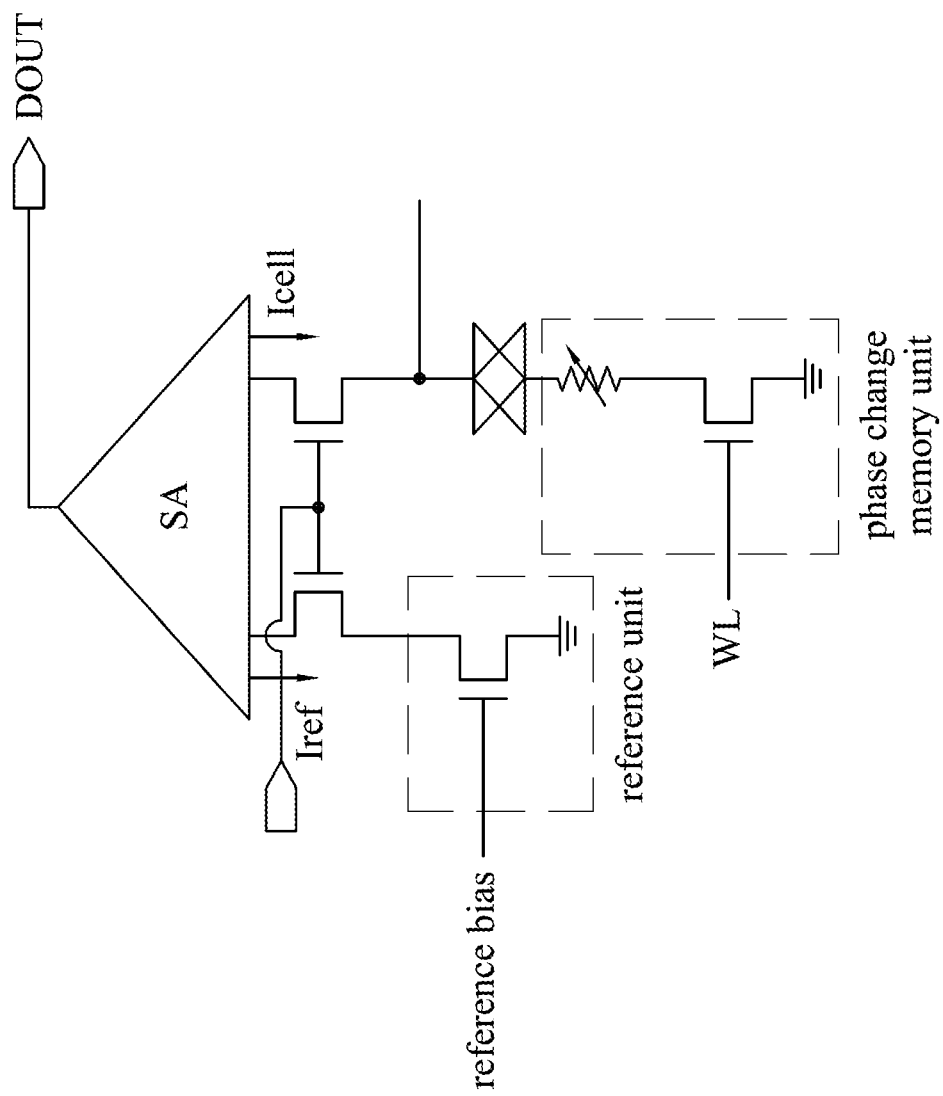
FIG. 1 is a diagram of a sensing-amplifying device according to prior art.

In accordance with common practice, the various described features/elements are not drawn to scale but instead are drawn to best illustrate specific features/elements relevant to the present invention. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

Figure 2:
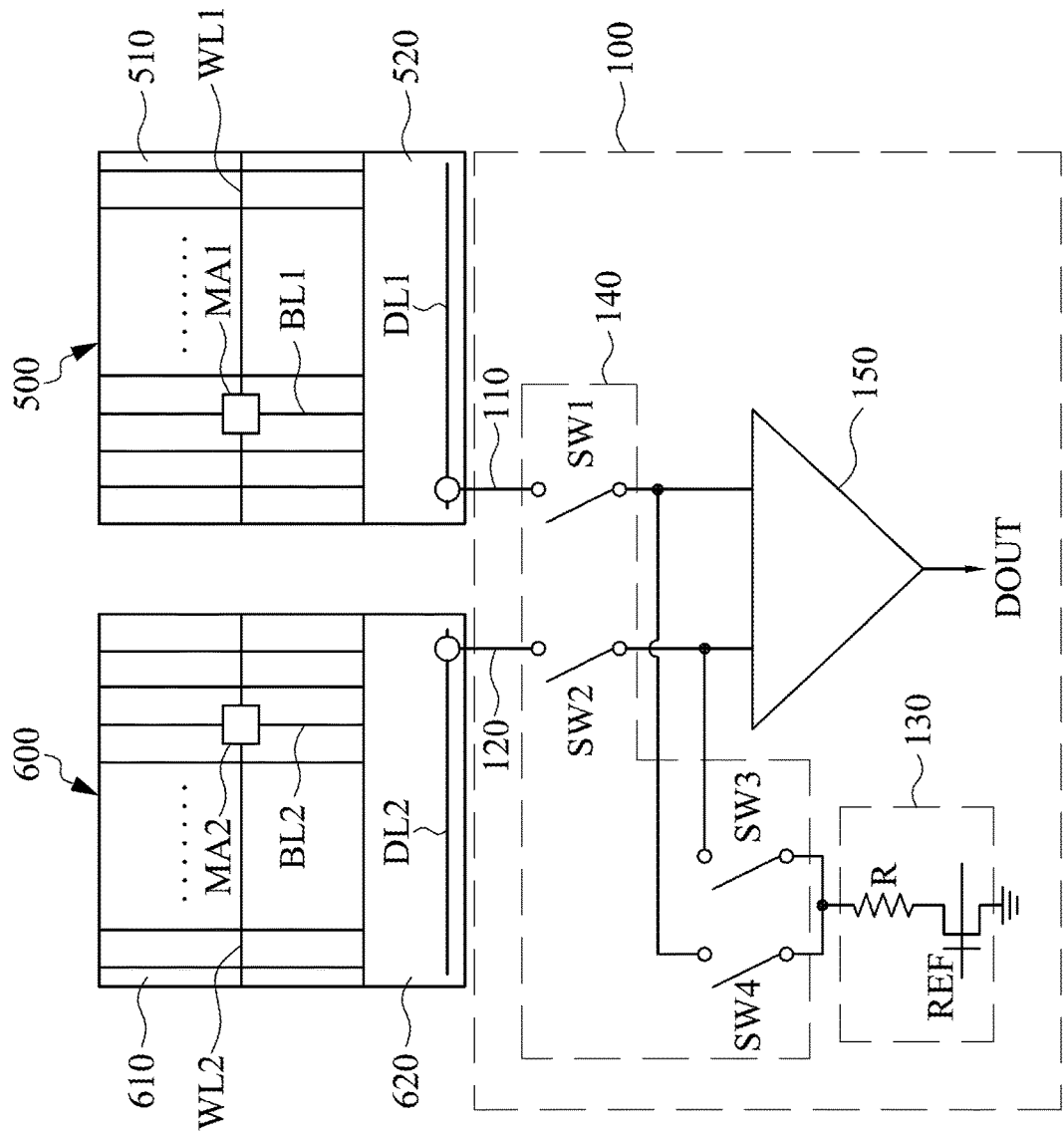
FIG. 2 is a relation diagram of a sensing-amplifying device and a memory according to some embodiments of the present disclosure.

Reference is now made to FIG. 2. FIG. 2 is a block diagram of a sensing-amplifying device 100 and memories 500, 600 according to some embodiments of the present disclosure. For facilitating the understanding of the present disclosure, memories 500, 600 are introduced firstly. The memories 500, 600 as shown in the figure are, for example, phase change memories (PCM); however, the present disclosure is not limited thereto. As shown in FIG. 2, the memory devices 500, 600 comprise memory arrays 510, 610 which include word lines WL1, WL2, bit lines BL1, BL2, and bit line driving circuits 520, 620. The memory arrays 510, 610 comprise a plurality of memory units (memory units MA1, MA2 are used as examples in the figure). The bit line driving circuits 520, 620 comprise signal lines DL1, DL2.

Referring to FIG. 2, the sensing-amplifying device 100 comprises a first input terminal 110, a second input terminal 120, a reference unit 130, a switching unit 140 and a sense amplifier 150. With respect to the structure, the first input terminal 110 is coupled to the first memory unit MA1 through the bit line driving circuit 520 of the memory 500, and the second input terminal 120 is coupled to the second memory unit MA2 through the bit line driving circuit 620 of the memory 600. As the structure illustrated in FIG. 2, the first input terminal 110 and the second input terminal 120 can be used to read data stored in the first memory unit MA1 and the second memory unit MA2 based on the actual requirements. The reference unit 130 is configured to provide a reference signal. The switching unit 140 is selectively coupled to the first input terminal 110, the second input terminal 120 and the reference unit 130.

With respect to the operation, two terminals of the sense amplifier 150 are coupled to the first input terminal 110 and the second input terminal 120 respectively by switching the switching unit 140 so as to operate in a twin memory unit mode, or one terminal of the sense amplifier 150 is coupled to the first input terminal 110 or the second input terminal 120, and the other terminal of the sense amplifier 150 is coupled to the reference unit 130 by switching the switching unit 140 so as to operate in a single memory unit mode. In one embodiment of the present disclosure, the sensing-amplifying device 100 can operate in the twin memory unit mode or the single memory unit mode. The twin memory unit mode is an operation mode that two memory units are used to store a bit of data, and the single memory unit mode is an operation mode that single memory unit is used to store a bit of data, which will be described in detail as below.

Figure 3:
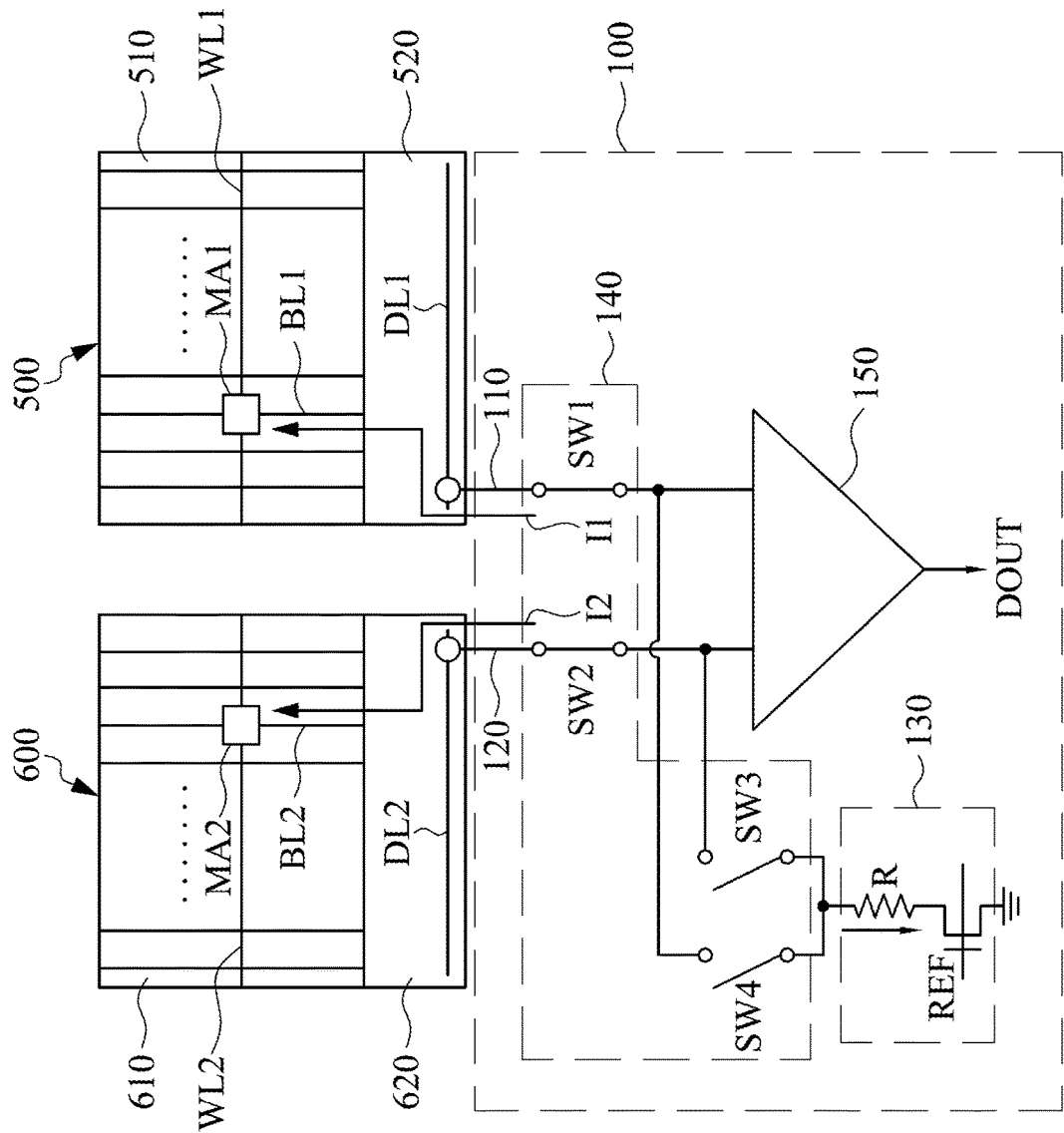
FIG. 3 is an operation relation diagram of a sensing-amplifying device and a memory according to some embodiments of the present disclosure.

FIG. 3 is an operation relation diagram of a sensing-amplifying device 100 and memories 500, 600 according to some embodiments of the present disclosure. As shown in the figure, two terminals of the sense amplifier 150 are a first terminal and a second terminal respectively. The switching unit 140 comprises a first switch SW1 and a second switch SW2. The first switch SW1 is selectively coupled to the first input terminal 110 and the first terminal of the sense amplifier 150. The second switch SW2 is selectively coupled to the second input terminal 120 and the second terminal of the sense amplifier 150. When operating in the twin memory unit mode, the first switch SW1 is turned on to couple to the first input terminal 110 and the first terminal of the sense amplifier 150, and the second switch SW2 is turned on to couple to the second input terminal 120 and the second terminal of the sense amplifier 150. As such, the data stored in the first memory unit MA1 and the second memory unit MA2 can be read out and compared through path I1 and path I2 by the sense amplifier 150, and an output data DOUT can be provided according to the compared result.

Figure 4:
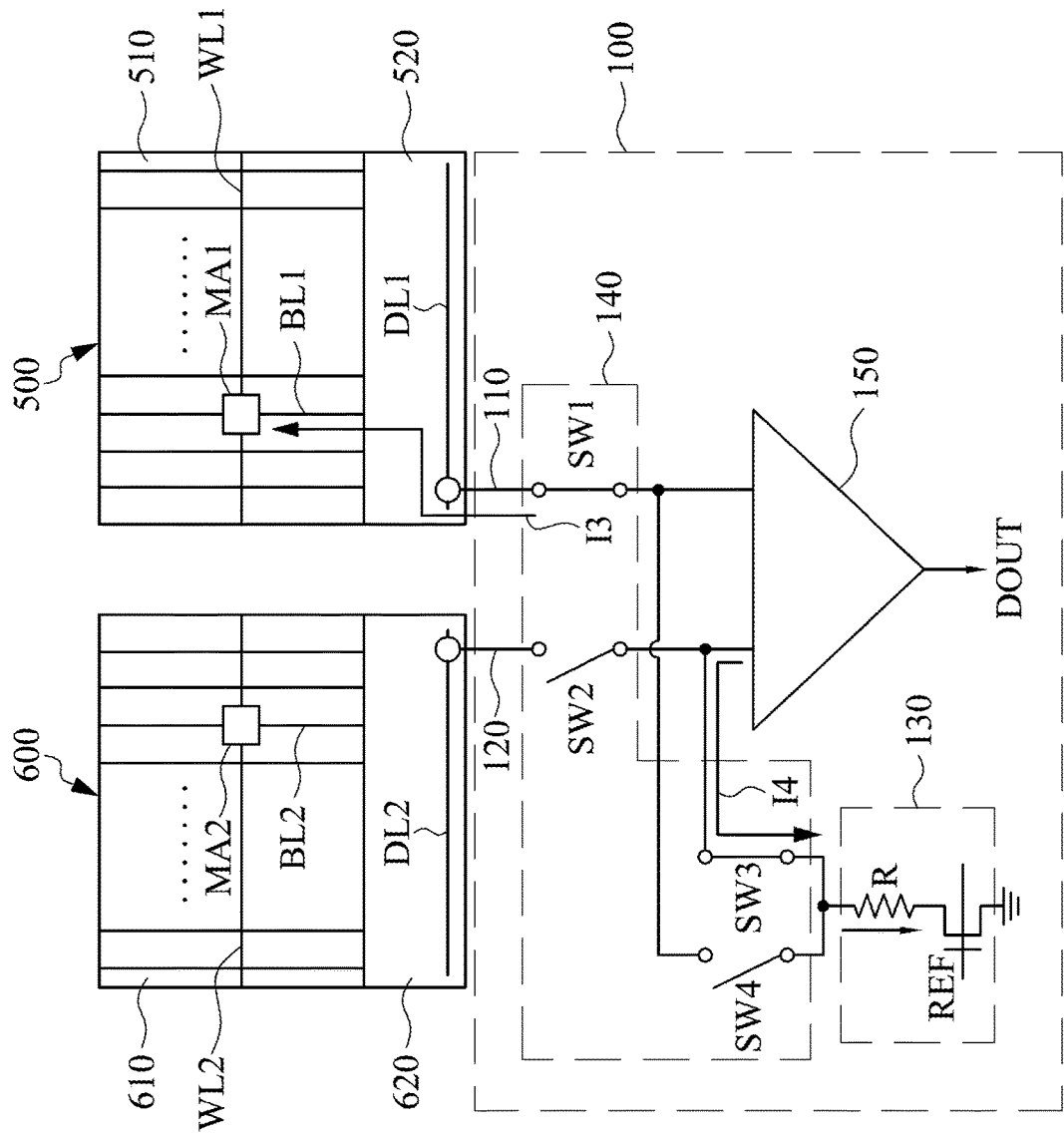
FIG. 4 is an operation relation diagram of a sensing-amplifying device and a memory according to some embodiments of the present disclosure.

FIG. 4 is an operation relation diagram of a sensing-amplifying device 100 and memories 500, 600 according to some embodiments of the present disclosure. As shown in the figure, the switching unit 140 further comprises a third switch SW3. The third switch SW3 is selectively coupled to the reference unit 130 and the second terminal of the sense amplifier 150. When operating in a single memory unit mode, the first switch SW1 is turned on to couple to the first input terminal 110 and the first terminal of the sense amplifier 150, and the third switch SW3 is turned on to couple to the reference unit 130 and the second terminal of the sense amplifier 150. As such, the data stored in the first memory unit MA1 can be read through path I3, and the reference data of the reference unit 130 can be read through path I4, so that the sense amplifier 150 can compare the above-mentioned data to provide the output data DOUT according to the compared result.

Figure 5:
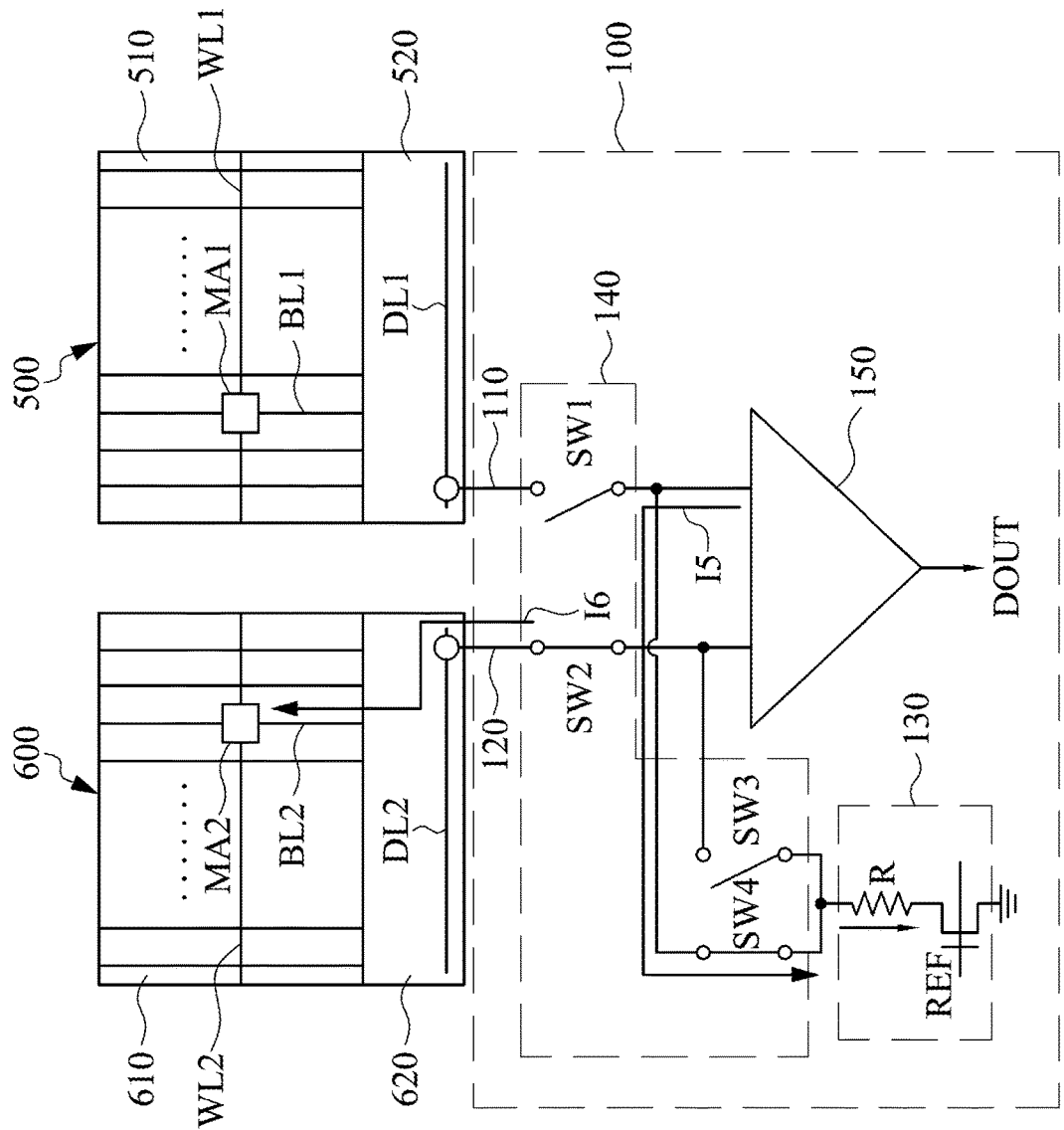
FIG. 5 is an operation relation diagram of a sensing-amplifying device and a memory according to some embodiments of the present disclosure.

FIG. 5 is an operation relation diagram of a sensing-amplifying device 100 and memories 500, 600 according to some embodiments of the present disclosure. As shown in the figure, the switching unit 140 further comprises a fourth switch SW4. The fourth switch SW4 is selectively coupled to the reference unit 130 and the first terminal of the sense amplifier 150. When operating in the single memory unit mode, the second switch SW2 is turned on to couple to the second input terminal 120 and the second terminal of the sense amplifier 150, and the fourth switch SW4 is turned on to couple to the reference unit 130 and the first terminal of the sense amplifier 150. As such, the reference data of the reference unit 130 can be read through path I5, and the data stored in the second memory unit MA2 can be read through path I6, so that the sense amplifier 150 can compare the above-mentioned data to provide the output data DOUT according to the compared result.

In some embodiments, the single memory unit mode is that the sense amplifier 150 reads a value of one of the first memory unit MA1 or the second memory unit MA2 through the bit line driving circuit 520, 620 of the memory 500, 600 and reads a value of the reference unit 130 so as to determine a bit of data. The twin memory unit mode is that the sense amplifier 150 reads a value of the first memory unit MA1 and a value of the second memory unit MA2 so as to determine a bit of data.

In some embodiments, each of the first memory unit MA1 and the second memory unit MA2 comprises a memory element or a memory layer (not shown). The memory layer is made of a specific material, in which the specific material may change its internal status based on external operating conditions (for example: crystalline, amorphous, magnetic field, etc.) and exhibits different electrical properties. Thus, according to different electrical properties (for example: resistance, magnetoresistance, etc.) presented by the memory layer, the first memory unit MA1 and the second memory unit MA2 store different data equivalently.

In addition, the reference unit 130 comprises a reference element or a memory layer (not shown). The material and the structure of the reference element or the memory layer are the same as that of the memory element.

In some embodiments, the first memory unit MA1 and the second memory unit MA2 and the reference unit 130 may be phase change random access memory units, and the memory layer may be implemented by a material such as a chalcogenide, but the embodiments of the present disclosure are not limited thereto. At different operating temperatures, the memory layer has different crystalline states to store different data equivalently.

Figure 6:
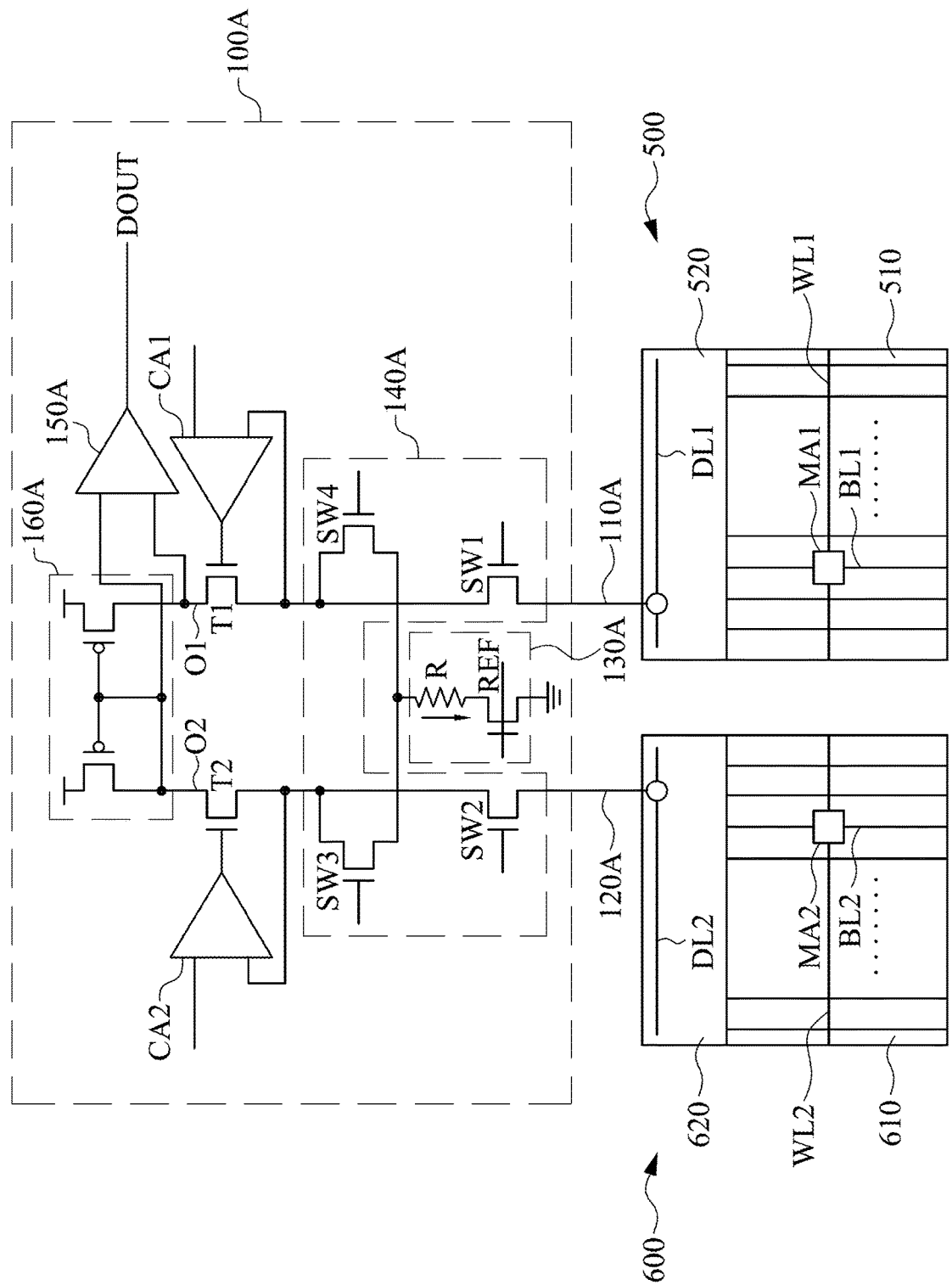
FIG. 6 is a relation diagram of a sensing-amplifying device and a memory according to some embodiments of the present disclosure.

FIG. 6 is a relation diagram of a sensing-amplifying device and a memory according to some embodiments of the present disclosure. In this embodiment, as shown in the figure, the sensing-amplifying device 100A comprises a current mirror 160A, a first transistor T1, a second transistor T2, a first comparator CA1, a second comparator CA2, a reference unit 130A, a first input terminal 110A, a second input terminal 120A, a switching unit 140A, and a sense amplifier 150A. The current mirror 160A comprises a first output terminal O1 and a second output terminal O2. The first transistor T1 comprises a first terminal, a second terminal and a control terminal, and the first terminal of the first transistor T1 is coupled to the first output terminal O1 of the current mirror 160A. The second transistor T2 comprises a first terminal, a second terminal and a control terminal, and the second transistor T2 of the first terminal is coupled to the second output terminal O2 of the current mirror 160A.

In addition, the first comparator CA1 comprises a first input terminal, a second input terminal, and a first output terminal. The first input terminal is configured to receive a bias signal REF BIAS. The second input terminal is coupled to the second terminal of the first transistor T1. The first output terminal is coupled to the control terminal of the first transistor T1. The second comparator CA2 comprises a third input terminal, a fourth input terminal, and a second output terminal. The third input terminal is configured to receive the bias signal REF BIAS. The fourth input terminal is coupled to the second terminal of the second transistor T2. The second output terminal is coupled to the control terminal of the second transistor T2. The reference unit 130A is configured to provide the reference signal. The first input terminal 110A is coupled to the first memory unit MA1 through the bit line driving circuit 520 of the memory 500. The second input terminal 120A is coupled to the second memory unit MA2 through the bit line driving circuit 620 of the memory 600. As the structure illustrated in FIG. 6, the first input terminal 110A and the second input terminal 120A can be used to read data stored in the first memory unit MA1 and the second memory unit MA2 based on the actual requirements.

In addition, the switching unit 140A is selectively coupled to the first input terminal 110A, the second input terminal 120A, the reference unit 130A, the first transistor T1, and the second transistor T2. The sense amplifier 150A comprises two terminals. The two terminals of the sense amplifier 150A are coupled to the first input terminal 110A and the second input terminal 120A respectively by switching the switching unit 140A so as to operate in the twin memory unit mode, or one terminal of the sense amplifier 150A is coupled to the first input terminal 110A or the second input terminal 120A and the other terminal of the sense amplifier 150A is coupled to the reference unit 130A by switching the switching unit 140A so as to operate in a single memory unit mode.

For example, the two terminals of the sense amplifier 150A are a first terminal and a second terminal respectively. The switching unit 140A comprises a first switch SW1 and a second switch SW2. The first switch SW1 is selectively coupled to the first input terminal 110A and the first terminal of the sense amplifier 150A. The second switch SW2 is selectively coupled to the second input terminal 120A and the second terminal of the sense amplifier 150A. When operating in the twin memory unit mode, the first switch SW1 is turned on to couple to the first input terminal 110A and the first terminal of the sense amplifier 150A, and the second switch SW2 is turned on to couple to the second input terminal 120A and the second terminal of the sense amplifier 150A. As such, the data stored in the first memory unit MA1 and the second memory unit MA2 can be read out and compared by the sense amplifier 150A, and an output data DOUT can be provided according to the compared result.

In another embodiment, as shown in the figure, the switching unit 140A further comprises a third switch SW3. The third switch SW3 is selectively coupled to the reference unit 130A and the second terminal of the sense amplifier 150A. When operating in the single memory unit mode, the first switch SW1 is turned on to couple to the first input terminal 110A and the first terminal of the sense amplifier 150A, and the third switch SW3 is turned on to couple to the reference unit 130A and the second terminal of the sense amplifier 150A. As such, the data stored in the first memory unit MA1 and the reference data of the reference unit 130A can be read by the sense amplifier 150A so as to compare the above-mentioned data to provide the output data DOUT according to the compared result.

In another embodiment, as shown in the figure, the switching unit 140A further comprises a fourth switch SW4. The fourth switch SW4 is selectively coupled to the reference unit 130A and the first terminal of the sense amplifier 150. When operating in the single memory unit mode, the second switch SW2 is turned on to couple to the second input terminal 120A and the second terminal of the sense amplifier 150A, and the fourth switch SW4 is turned on to couple to the reference unit 130A and the first terminal of the sense amplifier 150A. As such, the reference data of the reference unit 130A and the data stored in the second memory unit MA2 can be read by the sense amplifier 150A so as to compare the above-mentioned data for providing the output data DOUT according to the compared result.

Based on the aforementioned embodiments, the present disclosure provides a sensing-amplifying device. For solving the problem that reading data from single memory unit easily cause errors, the accuracy of determining the data of the memory unit can be increased by reading the data from the dual memory unit to determine whether the data stored in the memory unit is "1" or "0". As such, the sensing-amplifying device needs to be adjusted accordingly to comply with the requirement of reading data from twin memory unit. In addition, when there is a need, the memory can be switched to single memory operating mode so as to increase the capacity of the memory. At this time, the structure of the sensing-amplifying device of the present disclosure can also be applied in single memory operation mode.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A sensing-amplifying device, comprising:
a first input terminal, coupled to a first memory unit;
a second input terminal, coupled to a second memory unit;
a reference unit, configured to provide a reference signal;
a switching unit, selectively coupled to the first input terminal, the second input terminal, and the reference unit; and
a sense amplifier, comprising two terminals, wherein the two terminals of the sense amplifier are coupled to the first input terminal and the second input terminal respectively by switching the switching unit so as to operate in a twin memory unit mode, or one terminal of the sense amplifier is coupled to the first input terminal or the second input terminal and the other terminal of the sense amplifier is coupled to the reference unit by switching the switching unit so as to operate in a single memory unit mode, and
wherein the two terminals of the sense amplifier are a first terminal and a second terminal respectively, wherein the switching unit comprises:
a first switch, selectively coupled to the first input terminal and the first terminal of the sense amplifier;
a second switch, selectively coupled to the second input terminal and the second terminal of the sense amplifier, wherein when operating in the twin memory unit mode, the first switch is turned on to couple to the first input terminal and the first terminal of the sense amplifier, and the second switch is turned on to couple to the second input terminal and the second terminal of the sense amplifier; and
a third switch, selectively coupled to the reference unit and the second terminal of the sense amplifier, wherein when operating in the single memory unit mode, the first switch is turned on to couple to the first input terminal and the first terminal of the sense amplifier, and the third switch is turned on to couple to the reference unit and the second terminal of the sense amplifier.

2. The sensing-amplifying device of claim 1, wherein the switching unit further comprises:
a fourth switch, selectively coupled to the reference unit and the first terminal of the sense amplifier, wherein when operating in the single memory unit mode, the second switch is turned on to couple to the second input terminal and the second terminal of the sense amplifier, and the fourth switch is turned on to couple to the reference unit and the first terminal of the sense amplifier.

3. The sensing-amplifying device of claim 2, wherein the single memory unit mode is that the sense amplifier reads a value of one of the first memory unit and the second memory unit and reads a value of the reference unit, so as to determine a bit of data; the twin memory unit mode is that the sense amplifier reads a value of the first memory unit and a value of the second memory unit, so as to determine a bit of data.

4. The sensing-amplifying device of claim 3, wherein each of the first memory unit and the second memory unit comprises a memory element, and the reference unit comprises a reference element, wherein both a material and a structure of the reference element and the memory element are the same.

5. The sensing-amplifying device of claim 4, wherein the memory element and the reference element are phase change memory elements.

6. A sensing-amplifying device, comprising:
a current mirror, comprising a first output terminal and a second output terminal;
a first transistor, comprising a first terminal which is coupled to the first output terminal of the current mirror;
a second transistor, comprising a first terminal which is coupled to the second output terminal of the current mirror;
a first comparator, comprising a first input terminal, a second input terminal, and a first output terminal, wherein the first input terminal is configured to receive a first bias signal, the second input terminal is coupled to a second terminal of the first transistor, and the first output terminal is coupled to a control terminal of the first transistor;
a second comparator, comprising a third input terminal, a fourth input terminal and a second output terminal, wherein the third input terminal is configured to receive a second bias signal, the fourth input terminal is coupled to a second terminal of the second transistor, and the second output terminal is coupled to a control terminal of the second transistor;
a reference unit, configured to provide a reference signal;
a first input terminal, coupled to a first memory unit;
a second input terminal, coupled to a second memory unit;
a switching unit, selectively coupled to the first input terminal, the second input terminal, and the reference unit; and
a sense amplifier, comprising two terminals, wherein the two terminals of the sense amplifier are coupled to the first input terminal and the second input terminal respectively by switching the switching unit so as to operate in a twin memory unit mode, or one terminal of the sense amplifier is coupled to the first input terminal or the second input terminal and the other terminal of the sense amplifier is coupled to the reference unit by switching the switching unit so as to operate in a single memory unit mode.

7. The sensing-amplifying device of claim 6, wherein the two terminals of the sense amplifier are a first terminal and a second terminal respectively, wherein the switching unit comprises:
a first switch, selectively coupled to the first input terminal and the first terminal of the sense amplifier; and
a second switch, selectively coupled to the second input terminal and the second terminal of the sense amplifier, wherein when operating in the twin memory unit mode, the first switch is turned on to couple to the first input terminal and the first terminal of the sense amplifier, and the second switch is turned on to couple to the second input terminal and the second terminal of the sense amplifier.

8. The sensing-amplifying device of claim 7, wherein the switching unit further comprises:
a third switch, selectively coupled to the reference unit and the second terminal of the sense amplifier, wherein when operating in the single memory unit mode, the first switch is turned on to couple to the first input terminal and the first terminal of the sense amplifier, and the third switch is turned on to couple to the reference unit and the second terminal of the sense amplifier; and a fourth switch, selectively coupled to the reference unit and the first terminal of the sense amplifier, wherein when operating in the single memory unit mode, the second switch is turned on to couple to the second input terminal and the second terminal of the sense amplifier, and the fourth switch is turned on to couple to the reference unit and the first terminal of the sense amplifier.

* * * * *